United States Patent
Li et al.

(10) Patent No.: US 12,080,524 B2
(45) Date of Patent: Sep. 3, 2024

(54) SEMICONDUCTOR PROCESSING CHAMBER

(71) Applicant: BEIJING NAURA MICROELECTRONICS EQUIPMENT CO., LTD., Beijing (CN)

(72) Inventors: Yan Li, Beijing (CN); Shixuan Guo, Beijing (CN); Xingfei Mao, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/260,662

(22) PCT Filed: Dec. 23, 2021

(86) PCT No.: PCT/CN2021/140702
§ 371 (c)(1),
(2) Date: Jul. 7, 2023

(87) PCT Pub. No.: WO2022/151939
PCT Pub. Date: Jul. 21, 2022

(65) Prior Publication Data
US 2024/0266150 A1      Aug. 8, 2024

(30) Foreign Application Priority Data
Jan. 18, 2021 (CN) .......................... 202110062620.8

(51) Int. Cl.
*H01J 37/32* (2006.01)
(52) U.S. Cl.
CPC .... *H01J 37/32522* (2013.01); *H01J 37/3244* (2013.01); *H01J 37/32513* (2013.01);
(Continued)

(58) Field of Classification Search
None
See application file for complete search history.

(56) References Cited

U.S. PATENT DOCUMENTS

| 5,342,472 A | * | 8/1994 | Imahashi | .......... | H01J 37/32192 |
| | | | | | 118/723 R |
| 5,556,501 A | * | 9/1996 | Collins | .......... | H01J 37/32458 |
| | | | | | 257/E21.252 |

(Continued)

FOREIGN PATENT DOCUMENTS

| CN | 105789009 A | 7/2016 |
| CN | 105826155 A | 8/2016 |

(Continued)

OTHER PUBLICATIONS

The World Intellectual Property Organization (WIPO) International Search Report for PCT/CN2021/140702 Feb. 8, 2022 5 Pages (including translation).

*Primary Examiner* — Srinivas Sathiraju
(74) *Attorney, Agent, or Firm* — ANOVA LAW GROUP, PLLC

(57) ABSTRACT

A semiconductor processing chamber includes a chamber having an opening at a top of the chamber, a housing disposed above the opening, a dielectric window disposed inside the housing and above the opening, a coil arranged circumferentially at an inner top wall of the housing; a hot air hood disposed inside the housing and fixedly attached to the dielectric window, where the hot air hood and the inner top wall of the housing are separated by a clearance gap, and the hot air hood includes a heating compartment for heating the dielectric window and at least two air passage ports connected to the heating compartment; and an air distribution structure being fixedly attached to the housing and
(Continued)

including a plurality of air passages, at least two air exchange ports located outside the housing for air intake and air discharge.

11 Claims, 6 Drawing Sheets

(52) U.S. Cl.
CPC . *H01J 37/32834* (2013.01); *H01J 2237/3341* (2013.01); *H01J 2237/3348* (2013.01)

(56) References Cited

U.S. PATENT DOCUMENTS

| | | | | |
|---|---|---|---|---|
| 5,838,108 A | * | 11/1998 | Frank | H01J 65/044 315/39 |
| 5,888,414 A | * | 3/1999 | Collins | H01J 37/32165 257/E21.252 |
| 6,015,465 A | * | 1/2000 | Kholodenko | H01L 21/67248 118/712 |
| 6,036,878 A | * | 3/2000 | Collins | H01J 37/32458 216/68 |
| 6,068,784 A | * | 5/2000 | Collins | H01J 37/321 257/E21.252 |
| 6,251,792 B1 | * | 6/2001 | Collins | H01L 21/6831 257/E21.252 |
| 6,444,137 B1 | * | 9/2002 | Collins | H01J 37/32174 257/E21.252 |
| 6,488,807 B1 | * | 12/2002 | Collins | H01J 37/32522 257/E21.252 |
| 6,518,195 B1 | * | 2/2003 | Collins | C23C 16/517 438/743 |
| 6,545,420 B1 | * | 4/2003 | Collins | H01J 37/3211 257/E21.252 |
| 6,623,596 B1 | * | 9/2003 | Collins | H01J 37/32871 156/345.43 |
| 7,100,532 B2 | * | 9/2006 | Pribyl | H01Q 21/205 343/866 |
| 7,276,122 B2 | * | 10/2007 | Devine | H01L 21/6719 156/345.31 |
| 10,692,741 B2 | * | 6/2020 | Verbaas | H01L 21/6719 |
| 11,417,545 B2 | * | 8/2022 | Verbaas | H01L 21/67248 |
| 2002/0004309 A1 | * | 1/2002 | Collins | H01J 37/32146 438/719 |
| 2004/0263412 A1 | * | 12/2004 | Pribyl | H01J 37/32082 343/866 |
| 2005/0247265 A1 | * | 11/2005 | Devine | H01L 21/6719 427/248.1 |
| 2011/0039417 A1 | * | 2/2011 | Matsumoto | H05H 1/46 438/758 |
| 2016/0307781 A1 | * | 10/2016 | Berry, III | H01L 21/67069 |
| 2018/0247796 A1 | * | 8/2018 | Mcchesney | H01J 37/32082 |

FOREIGN PATENT DOCUMENTS

| | | | | |
|---|---|---|---|---|
| CN | 108695148 A | | 10/2018 | |
| CN | 109041395 A | | 12/2018 | |
| CN | 110459456 A | | 11/2019 | |
| CN | 110706994 A | | 1/2020 | |
| CN | 111063603 A | | 4/2020 | |
| CN | 111725110 A | | 9/2020 | |
| CN | 112820616 A | | 5/2021 | |
| CN | 111357075 B | * | 12/2023 | F25D 1/00 |
| JP | 6551673 B2 | | 7/2019 | |
| KR | 101693145 B1 | | 1/2017 | |
| TW | I534887 B | | 5/2016 | |
| TW | I601452 B | | 10/2017 | |

* cited by examiner

SEMICONDUCTOR PROCESSING CHAMBER

CROSS-REFERENCE TO RELATED APPLICATIONS

This application is a national phase entry of PCT Patent Application No. PCT/CN2021/140702, filed on Dec. 23, 2021, which claims the priority of Chinese Patent Application No. 202110062620.8, filed on Jan. 18, 2021, the entire contents of all of which are incorporated herein by reference.

TECHNICAL FIELD

The present disclosure relates to the technical field of semiconductor processing technologies and, more particularly, to a semiconductor processing chamber.

BACKGROUND

Etching is a process of selectively removing unnecessary materials from a surface of a semiconductor such as a wafer using a chemical or a physical method. It is a general term for a process of stripping and removing materials through using solutions, reactive ions, or other mechanical methods. In the field of integrated circuit manufacturing, a semiconductor processing chamber is often used to perform an etching process through using the reactive ions.

However, in an existing semiconductor processing chamber, a hot air hood for heating a dielectric window is located between the dielectric window and an inner top wall of a housing (for example, used as a coil bracket), and is fixedly attached to the dielectric window when being pressed by the inner top wall of the housing, such that the hot air hood produces a reaction force on the inner top wall of the housing to push the inner top wall of the housing to cause deformation. The deformed inner top wall in turn causes a change to a distribution structure of coils attached to the inner top wall, thereby affecting uniform distribution of ions and free radicals in a plasma.

SUMMARY

The present disclosure provides a semiconductor processing chamber to solve problem of the deformation of the top wall of the housing and the change of coil distribution structure caused by the compression of the top wall of the housing by the hot air hood, and subsequent uneven distribution of the ions and free radicals in a plasma.

To solve the above problem, the present disclosure provides the following technical solutions.

One aspect of the present disclosure provides a semiconductor processing chamber. The semiconductor processing chamber includes a chamber having an opening at a top of the chamber; a housing disposed above the opening; a dielectric window disposed inside the housing and above the opening; a coil arranged circumferentially at an inner top wall of the housing; a hot air hood disposed inside the housing and fixedly attached to the dielectric window, where the hot air hood and the inner top wall of the housing are separated by a clearance gap, and the hot air hood includes a heating compartment for heating the dielectric window and at least two air passage ports connected to the heating compartment; and an air distribution structure being fixedly attached to the housing and including a plurality of air passages, at least two air exchange ports located outside the housing for air intake and air discharge, and at least two transfer ports located inside the housing and respectively connected to the at least two air exchange ports. Equal numbers of exchange ports and transfer ports are connected to each other in a one-to-one correspondence.

Further, the hot air hood includes a hood body and a connecting member disposed at an outer wall of the hood body, and the hood body is fixedly attached to the dielectric window through the connecting member.

Further, an opening is configured at a bottom of the hood body, an inner wall of the hood body and a top surface of the dielectric window are enclosed to form a heating compartment, and a flanging is configured at a surrounding edge of the hood body located at the opening facing the outside of the heating compartment, and the flanging is the connecting member.

Further, the air distribution structure includes at least two plug-in connectors, each plug-in connector includes a transfer port, the plug-in connector is inserted into an air passage port to connect between the transfer port and the air passage port, and a sealing ring is configured between an outer wall of the plug-in connector and an inner wall of the air passage port to seal the air passage port.

Further, the outer wall of the plug-in connector is configured with an annular dovetail groove surrounding its circumference, the sealing ring is arranged partly in the annular dovetail groove, the sealing ring extends partly out of the annular dovetail groove and pushes against the inner wall of the air passage port.

Further, the heating compartment includes a plurality of heating sub-chamber separated from each other, each heating sub-chamber is connected to two air passage ports, the air passage ports connected to different heating sub-chambers are different, one of the two air passage ports connected to the same heating sub-chamber is an air inlet for air intake, and the other of the two air passage ports connected to the same heating sub-chamber is an air outlet for air discharge.

Further, the heating compartment includes a plurality of concentric ring-shaped compartments and a partition plate extending in a radial direction of the plurality of concentric ring-shaped compartments, the partition plate symmetrically divides each ring-shaped compartment into two half ring-shaped compartments, the half ring-shaped compartments are the heating sub-compartments, and the air inlet and the air outlet connected to the same heating sub-compartment are located at both ends of the same heating sub-compartment.

Further, a first pressure release hole is configured between two adjacent heating sub-compartments with different diameters to facilitate connection between two adjacent heating sub-compartments with different diameters, and the heating sub-compartment with the smallest diameter is configured with a second pressure release hole connected to the outside of the heating compartment.

Further, the number of air passages is four, two air passages are air intake passages, the other two air passages are air discharge passages, the two air intake passages are respectively arranged on both sides of the partition plate, the two air discharge passages are also respectively arranged on both sides of the partition plate, each air intake passage and each air discharge passage both have two transfer ports, and each air intake passage and each air discharge passage both have the air exchange port. The two transfer ports of each air intake passage are respectively connected to inlets of two adjacent heating sub-chambers located on the same side of the partition plate. The two transfer ports of each air discharge passage are respectively connected to outlets of two adjacent heating sub-chambers located on the same side of the partition plate.

Further, the air exchange ports of the two air intake passages are used to connect to the air outlet of a first heater and the air outlet of a second heater, respectively. The air exchange ports of the two air discharge passages are used to connect to the air inlet of the first heater and the air inlet of the second heater, respectively.

Further, a boss is configured at a top surface of the hot air hood, the air passage port is connected to the heating compartment through a top surface of the boss, and the clearance gap is configured between the top surface of the boss and the inner top wall of the housing.

The embodiments of the present disclosure provide at least the following beneficial effects. Through directly fixing the hot air hood to the dielectric window and configuring a clearance gap between the hot air hood and an inner top wall of the housing, the semiconductor processing chamber avoids compression between the hot air hood and the housing, avoids the deformation of the top wall of the housing and the change of coil distribution structure caused by the compression of the top wall of the housing by the hot air hood. Thus, the uniform distribution of the ions and free radicals in the plasma is ensured.

BRIEF DESCRIPTION OF THE DRAWINGS

The accompanying drawings briefly described here will be used to provide further understanding of the present disclosure, and constitute a part of the present disclosure. Embodiments of the present disclosure and descriptions thereof are used to illustrate the present disclosure, and are not intended to limit the present disclosure.

Figure 1:
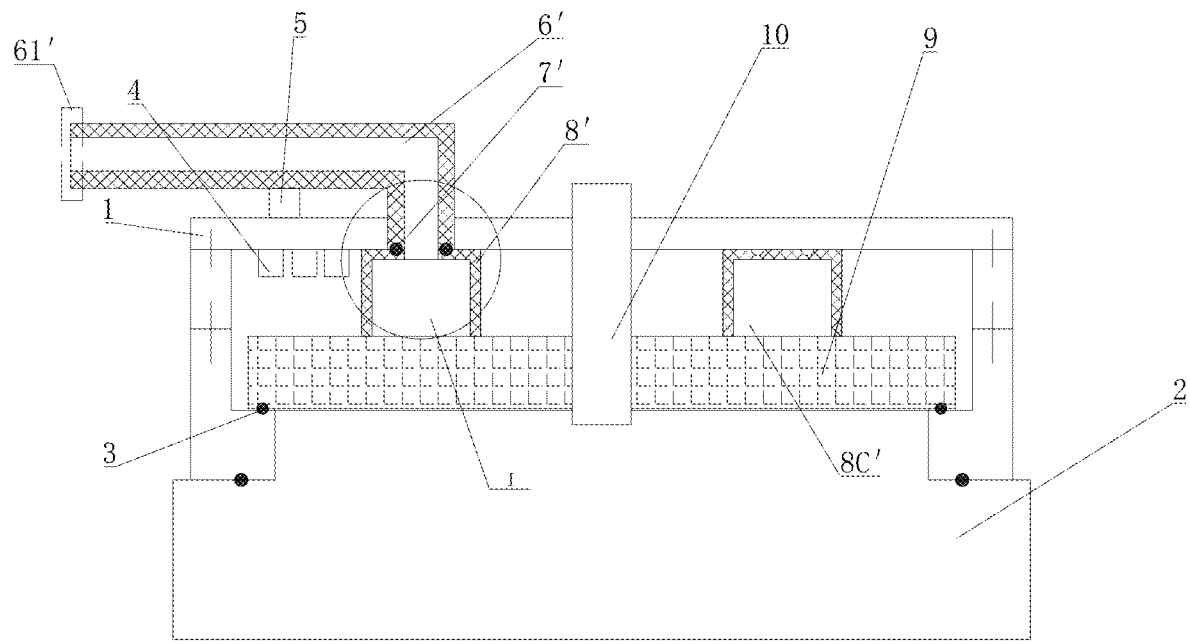
FIG. 1 is a schematic structural diagram of a semiconductor processing chamber in related art.

Numerals in the drawings include: 1—housing, 1A—bracket assembly, 1B—coil bracket plate, 2—chamber, 3—first sealing ring, 4—coil, 5—fixture, 6'—air passage, 61'—air exchange port, 62'—transfer port, 7'—second sealing ring, 8'—hot air hood, 8A'—air passage port, 8C'—heating compartment, 6—air passage, 61—air exchange port, 62—transfer port, 63—plug-in connector, 64—annular dovetail groove, 6A—air intake passage, 6B—air discharge passage, 7—sealing ring, 8—hot air hood, 8A—air passage port, 8B—connecting member, 8C—heating compartment, 8C1—heating sub-compartment, 8D1—first pressure release hole, 8D2—second pressure release hole, 8E—baffle plate, 9—dielectric window, 10—nozzle, G1—first heater, G2—second heater, P—first line position, Q—second line position, and O—clearance gap.

DETAILED DESCRIPTION OF THE EMBODIMENTS

To make the objectives, technical solutions, and advantages of the present disclosure clearer, the technical solutions of the present disclosure will be clearly and completely described below in conjunction with embodiments of the present disclosure and accompanying drawings. Apparently, the described embodiments are only some of the embodiments of the present disclosure, but not all of them. Based on the embodiments of the present disclosure, all other embodiments obtained by persons of ordinary skill in the art without making creative efforts belong to the protection scope of the present disclosure.

The technical solutions disclosed by various embodiments of the present disclosure will be described in detail below in conjunction with the accompanying drawings.

First, a semiconductor processing chamber involved in the related art is introduced.

As shown in FIG. 1, an opening is provided at a top of a chamber 2. A housing 1 is provided above the opening. A dielectric window 9 is provided on the housing 1 and above the opening. At the same time, a first sealing ring 3 for sealing is arranged between the bracket assembly 1A and the dielectric window 9.

A hot air hood 8' is located between the dielectric window 9 and an inner top wall of the housing 1, and is fixedly attached to the dielectric window 9 when being pressed by the inner top wall of the housing 1. A coil 4 is also disposed at the housing 1 and is arranged on the inner top wall of the housing 1.

Figure 2:
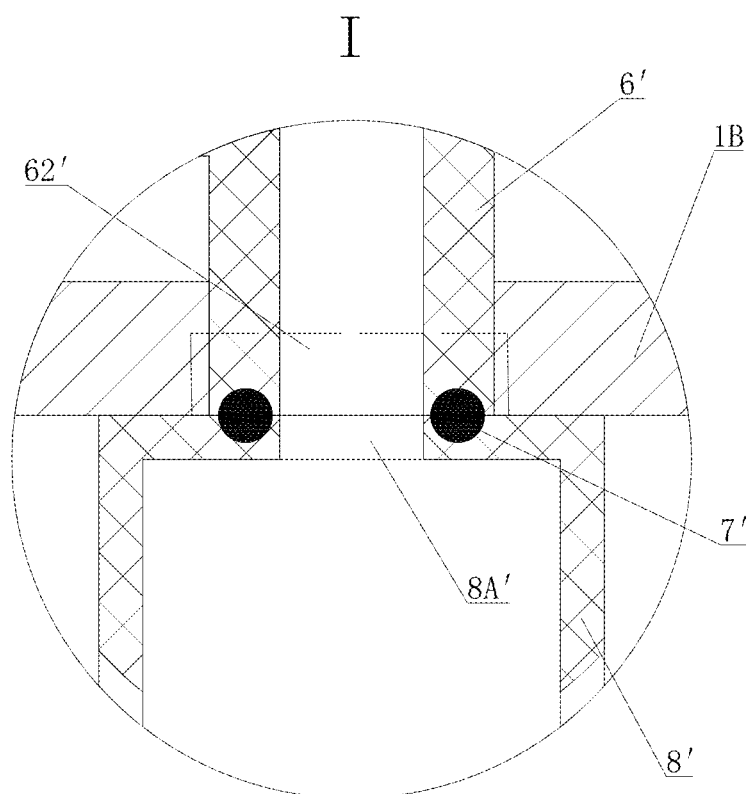
FIG. 2 is an enlarged view of portion I of FIG. 1.
Figure 3:
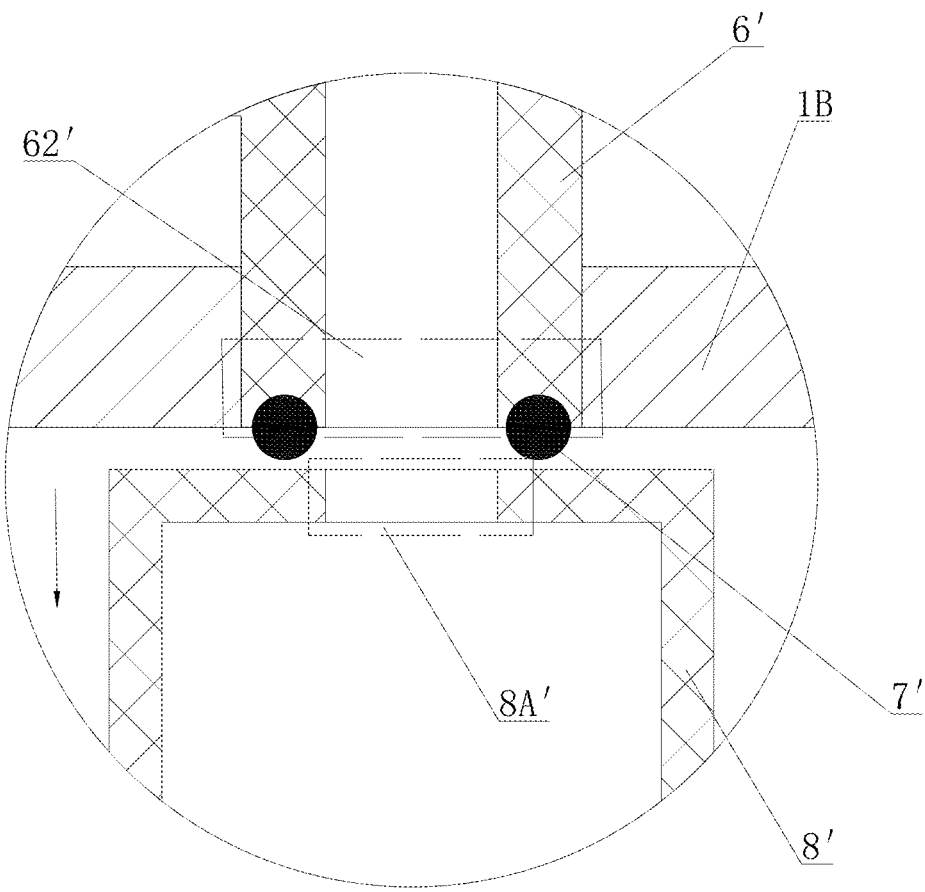
FIG. 3 is a schematic diagram showing a failure of a second sealing ring when using the semiconductor processing chamber in the related art.

As shown in FIGS. 1 to 3, two ends of an air passage 6' are respectively provided with an air exchange port 61' and a transfer port 62'. The air exchange port 61' is used to take in a hot air from the outside. The transfer port 62' is inserted on the top wall of the housing 1, and is located above the air passage port 8A' opened on a hot air hood 8', such that an external hot air can be passed into a heating compartment 8C' from the air exchange port 61', thereby facilitating the hot air hood 8' to heat the dielectric window 9 through the heating compartment 8C'.

As shown in FIG. 2, a second sealing ring 7' is provided between the transfer port 62' and the hot air hood 8'. In a normal state, an end of the transfer port 62' and the inner top wall of the hot air hood 8' are clamped against the second sealing ring 7', such that the second sealing ring 7' is compressed and deformed, thereby forming a seal on the heating compartment 8C'.

Figure 4:
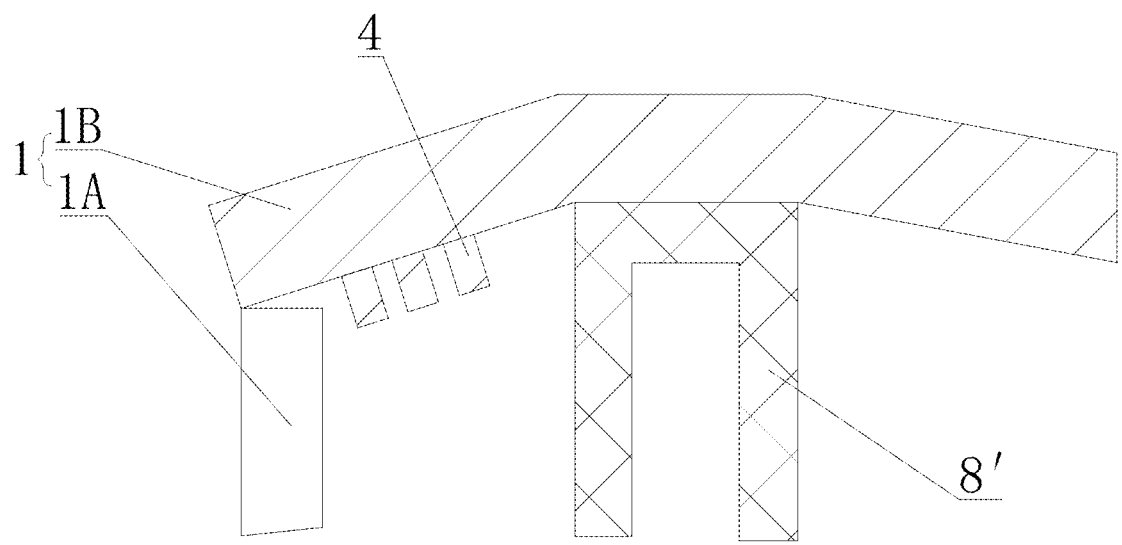
FIG. 4 is a schematic diagram showing a deformed coil bracket plate when using the semiconductor processing chamber in the related art.

The above-described device has two main problems. The first problem is that the hot air hood 8' is clamped by the housing 1 and the dielectric window 9, thereby being fixedly attached to the dielectric window 9. As a result, while the housing 1 is pressed against the hot air hood 8', the hot air hood 8' exerts a reaction force on the housing 1 as shown in FIG. 4, thereby pressing the inner top wall of the housing 1 into deformation, and subsequently causing the coil 4 disposed at the inner top wall of the housing 1 to deform. Thus, a distribution structure of the coil 4 disposed at the inner top wall of the housing 1 is changed, thereby affecting uniform distribution of ions and free radicals in a plasma.

The second problem is that the chamber 2 needs to be vacuumed during operation, such that a pressure difference can be formed between an upper portion and a lower portion of the dielectric window 9. The pressure difference causes a downward pressure on the dielectric window 9, thereby compressing the first sealing ring 3 into deformation, and causing the dielectric window 9 itself to deform inward. The deformation of the first sealing ring 3 and the dielectric window 9 will be superimposed on each other, which causes the hot air hood 8' to sink downward, and subsequently causes the hot air hood 8' to be separated from the transfer port 62' as shown in FIG. 3. Thus, the second sealing ring 7' is no longer able to seal the heating compartment 8C'.

Both problems cause the semiconductor processing chamber to fail to operate normally, thereby unable to etch an integrated circuit normally. The semiconductor processing chamber provided by the embodiments of the present disclosure is an improvement made to solve one or more existing problems. The semiconductor processing chamber provided by the embodiments of the present disclosure will be described in detail below.

Figure 5:
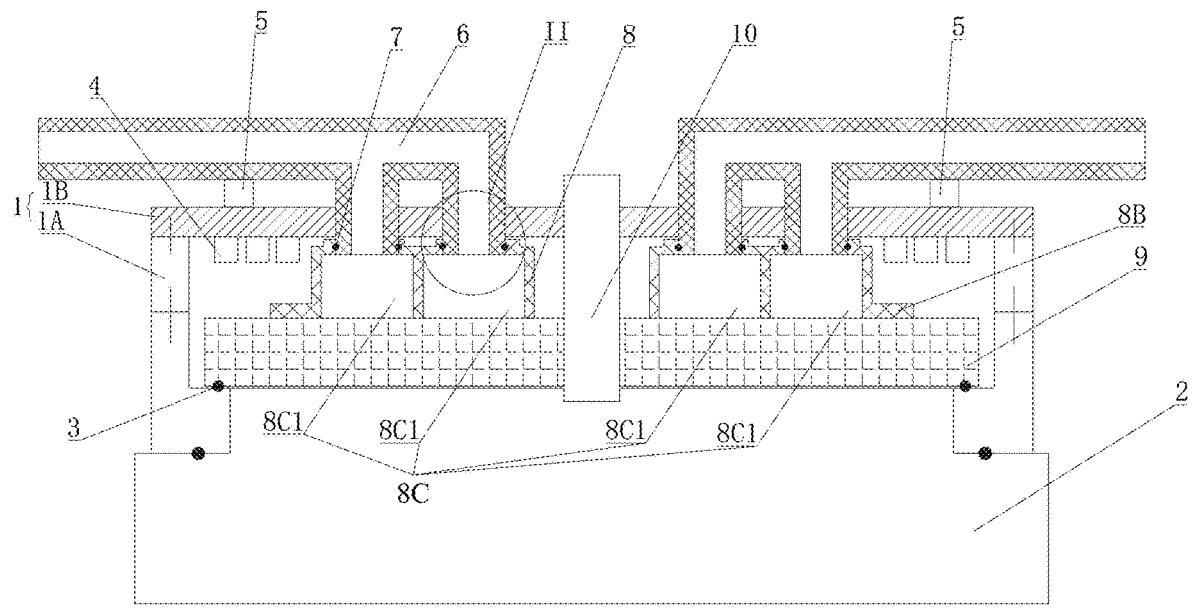
FIG. 5 is a schematic structural diagram of an exemplary semiconductor processing chamber according to some embodiments of the present disclosure.

As shown in FIG. 5, the semiconductor processing chamber provided by the embodiments of the present disclosure includes a chamber 2 and a housing 1. An opening is provided at a top of the chamber 2. The housing 1 is arranged to cover the opening. The housing 1 includes a bracket assembly 1A and a coil bracket plate 1B. The coil bracket plate 1B forms a top wall of the housing 1, and the bracket assembly 1A forms a peripheral wall of the housing 1. That is, the bracket assembly 1A is ring-shaped, and is arranged around a periphery or rim of an end surface of the coil bracket plate 1B. A bottom surface of the coil bracket plate 1B faces toward the chamber 2 and constitutes an inner top wall of the housing 1. The bracket assembly 1A and the coil bracket plate 1B may be arranged integrally, or may be assembled together by means of bolts, rivets, welding, bonding, and the like.

The semiconductor processing chamber further includes a dielectric window 9 disposed inside the housing 1 above the opening of the chamber 2 to block the opening. In some embodiments, a stepped surface may be provided on the bracket assembly 1A, such that stepped holes including a large hole and a small hole can be formed inside the bracket assembly 1A. The bracket assembly 1A is arranged above the chamber 2. The bracket assembly 1A includes the small hole with a diameter smaller than a diameter of the dielectric window 9, and the large hole with a diameter greater than the diameter of the dielectric window 9, such that a lower end surface of the dielectric window 9 can be placed on a step surface of the bracket assembly 1A, and the dielectric window 9 can provide an insulation space between its upper and lower end surfaces. In addition, the bracket assembly 1A is disposed between the coil bracket plate 1B and the chamber 2 such that the coil bracket plate 1B and the chamber 2 are separated from each other. The chamber 2 is sealed by providing the first sealing ring 3 between the lower end surface of the dielectric window 9 and the stepped surface of the bracket assembly 1A.

Figure 6:
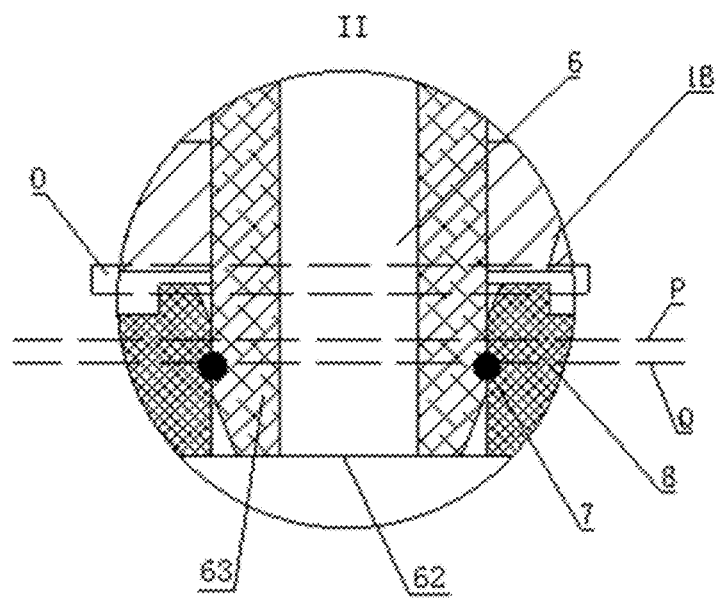
FIG. 6 is an enlarged view of portion II of FIG. 5.

As shown in FIG. 5 and FIG. 6, the semiconductor processing chamber provided by the embodiments of the present disclosure further includes the coil 4 and a hot air hood 8. The coil 4 is disposed at the inner top wall of the housing 1, that is, the bottom surface of the coil bracket plate 1B. The hot air hood 8 is located inside the housing 1, and the hot air hood 8 is fixedly attached to the dielectric window 9. For example, the hot air hood 8 is fixedly attached to the dielectric window 9 by means of welding and bonding, etc. At the same time, a clearance gap O is provided between the inner top wall (the bottom surface of the coil bracket plate 1B) of the housing 1 and the hot air hood 8 to prevent deformation and rupture of the coil bracket plate 1B caused by mutual compression between the inner top wall of the housing 1 and the hot air hood 8. In some embodiments, an orthogonal projection of the coil 4 on the dielectric window 9 is located outside the hot air hood 8, that is, the coil 4 is arranged along the periphery or rim of the bottom surface of the coil bracket plate 1B.

Figure 10:
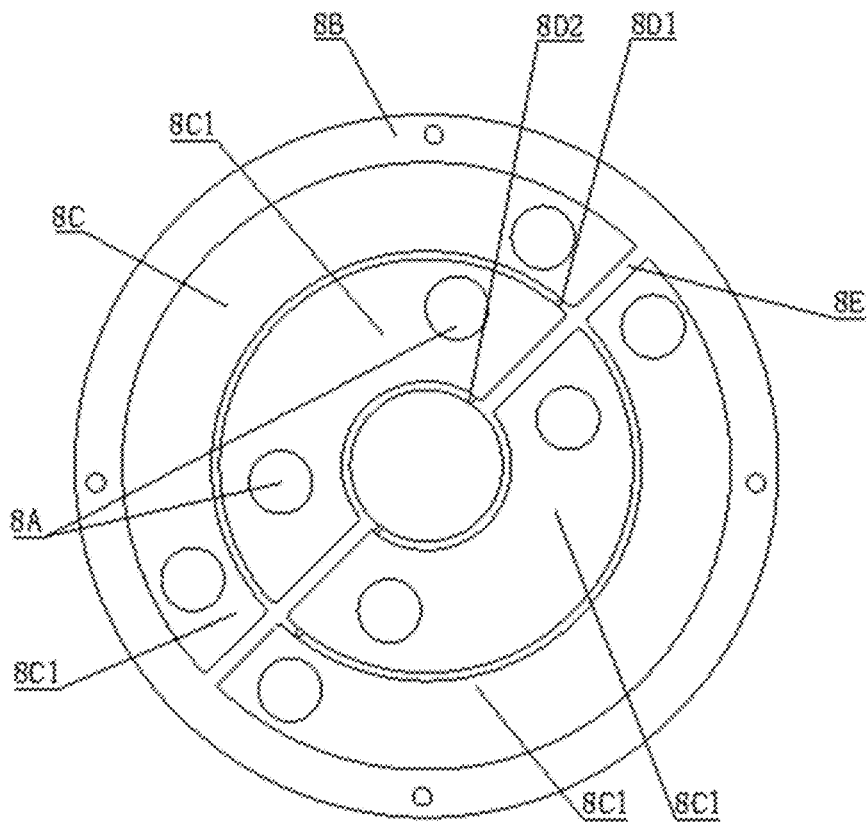
FIG. 10 is a schematic structural diagram of an exemplary hot air hood according to some embodiments of the present disclosure.

As shown in FIG. 5 and FIG. 10, the hot air hood 8 includes a heating compartment 8C for heating the dielectric window 9 and at least two air passage ports 8A that are connected to the heating compartment 8C and are used for taking air into and discharging air out of the heating compartment 8C. In some embodiments, every two air passage ports 8A may be formed into a group, and one of the two air passage ports 8A in each group is used for taking in the air, and the other is used for discharging the air. At least one group of the two air passage ports 8A is provided inside the hot air hood 8.

Figure 7:
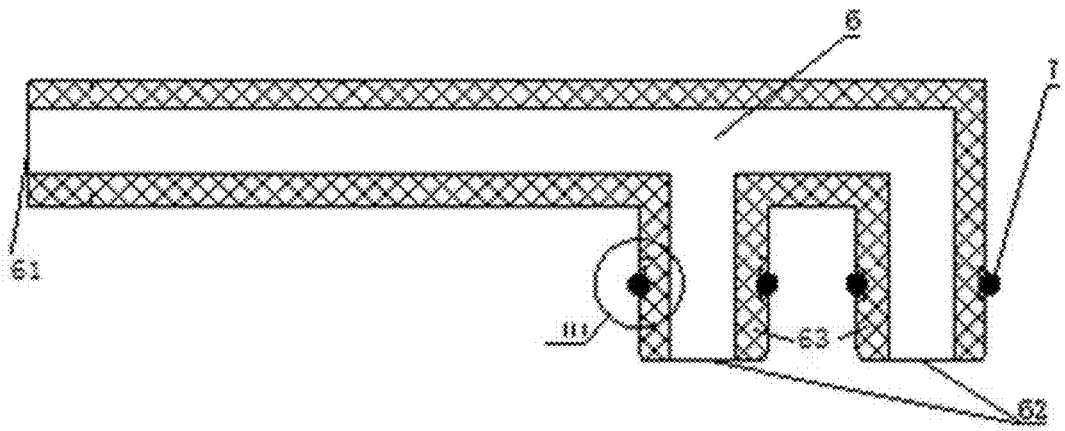
FIG. 7 is a schematic structural diagram of an exemplary air distribution structure according to some embodiments of the present disclosure.
Figure 9:
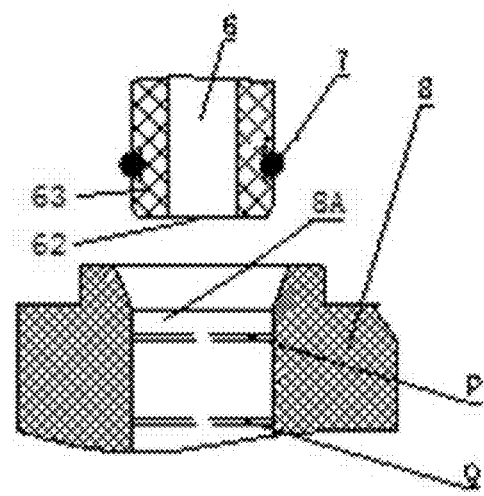
FIG. 9 is a schematic diagram showing connecting a plug-in connector into a port of an air passage according to some embodiments of the present disclosure.

As shown in FIG. 5, FIG. 7, and FIG. 9, the semiconductor processing chamber provided by the embodiments of the present disclosure also includes an air distribution structure, which is fixedly connected to the housing 1 and includes a plurality of air passages 6. The plurality of air passages 6 include at least two air exchange ports 61 and at least two transfer ports 62. The at least two air exchange ports 61 are located outside the housing 1 for air intake and air discharge. The at least two transfer ports 62 are located inside the housing 1. A number of the transfer ports 62 is the same as a number of the air passage ports 8A. The transfer ports 62 are respectively connected to the air passage ports 8A. In this way, the heating compartment 8C of the hot air hood 8 is connected to the outside through the plurality of air passages 6, thereby facilitating circulation of the hot air. In some embodiments, if two air passage ports 8A form a group, the transfer ports 62 of the plurality of air passages 6 also forms a group of two. The number of groups of the transfer ports 62 arranged in the semiconductor processing chamber is the same as the number of groups of the air passage ports 8A arranged in the semiconductor processing chamber, and they are arranged in one-to-one correspondence. One of the transfer ports 62 in each group arranged in the semiconductor processing chamber is used to take air into the heating compartment 8C, and the other is used to discharge air out of the heating compartment 8C.

In some embodiments, as shown in FIG. 5, the semiconductor processing chamber provided by the embodiments of the present disclosure further includes a fixture 5. The fixture 5 is located at a top surface of the coil bracket plate 1B, and is located between the air distribution structure and the coil bracket plate 1B. The air distribution structure is fixedly attached to the coil bracket plate 1B through the fixture 5.

When the semiconductor processing chamber is in operation, it is necessary to vacuumize the chamber 2, and at the same time, the hot air is passed into the heating compartment 8C through the air exchange ports 61 of the plurality of air passages 6 for air intake and the transfer ports 62 of the plurality of air passages 6 for air discharge. After the hot air fully exchanges heat with the dielectric window 9 in the heating compartment 8C, the hot air is then discharged sequentially through the transfer ports 62 of the plurality of air passages 6 for air intake and the air exchange ports 61 of the plurality of air passages 6 for air discharge, such that the hot air is periodically taken in and discharged out to facilitate the heating of the dielectric window 9.

Further, because the hot air hood 8 is directly fixed on the dielectric window 9, there is no need to apply a pre-tightening force to the hot air hood 8 by means of the housing 1. At the same time, through configuring the clearance gap O between the hot air hood 8 and the inner top wall (bottom surface of the coil bracket plate 1B) of the housing 1, the reaction force of the hot air hood 8 on the shell 1 is avoided, thereby preventing the coil bracket plate 1B from being deformed by the compression of the hot air hood 8, ensuring structural stability of the coil 4, improving the uniform distribution of ions and free radicals in the plasma, and ensuring the normal operation of the semiconductor processing chamber.

Further, as shown in FIG. 6 and FIG. 9, the air distribution structure includes at least two plug-in connectors 63. Each plug-in connector 63 includes a transfer port 62. The at least two plug-in connectors 63 can be inserted into corresponding air passage ports 8A to connect between the transfer ports 62 and corresponding air passage ports 8A. A sealing ring 7 is provided between an outer wall of the plug-in connector 63 and an inner wall of the air passage port 8A. In this way, a connection between the transfer port 62 and the air passage port 8A can be sealed circumferentially through the sealing ring 7.

As shown in FIG. 6 and FIG. 9, when the semiconductor processing chamber is in a normal state, the sealing ring 7 is at a second line position Q of the air passage port 8A, that is, the plug-in connector 63 contacts with the air passage port 8A at the second line position Q through the sealing ring 7. When the semiconductor processing chamber is in operation, as the chamber 2 is vacuumed, the dielectric window 9 will be depressed and the first sealing ring 3 will be compressed and deformed. Then, the hot air hood 8 will sink, that is, the hot air hood 8 is lowered to a certain height relatively to the plug-in connector 63. At this point, the sealing ring 7 will be located at a first line position P of the air passage port 8A, and the plug-in connector 63 contacts with the air passage port 8A at the first line position P through the sealing ring 7. It can be seen that although the hot air hood 8 sinks as the chamber 2 is vacuumed, because the plug-in connector 63 and the air passage port 8A are coupled through plug-in, and the connection between the transfer port 62 and the air passage port 8A is sealed by a circumferential sealing method, this makes the plug-in connector 63 consistently keep in contact with the air passage port 8A through the sealing ring 7, thereby avoiding vacuum failure.

Compared with the end surface sealing method shown in FIG. 2, the circumferential sealing method between the plug-in connector 63 and the air passage port 8A prevents the hot air hood 8 from pushing the transfer port 62 at the position of the air passage port 8A and avoids the compression force pressed by the hot air hood 8 against the coil bracket plate 1B through the air distribution structure, thereby further preventing the coil bracket plate 1B from being compressed and deformed by the hot air hood 8.

Further, as shown in FIG. 7 and FIG. 9, to facilitate the plug-in insertion between the transfer port 62 and the air passage port 8A, the outer wall of the plug-in connector 63 and the inner wall of the air passage port 8A may be chamfered or may be rounded. These treatments will not be described in detail herein.

Figure 8:
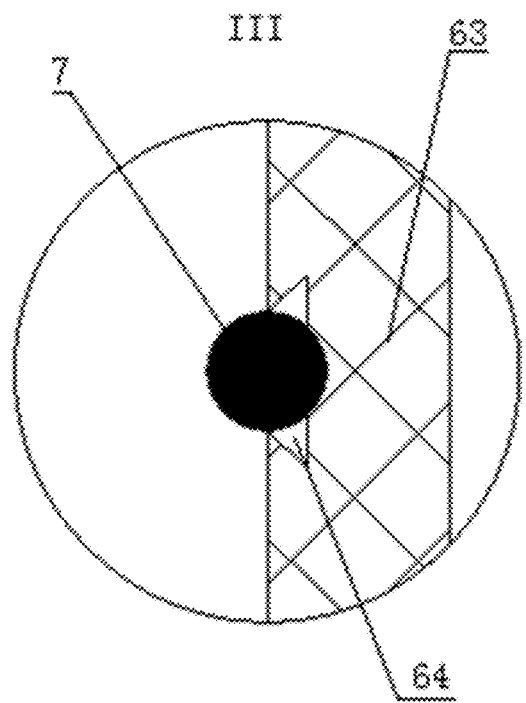
FIG. 8 is an enlarged view of portion III of FIG. 7.

In some embodiments, as shown in FIG. 7 and FIG. 8, the outer wall of the plug-in connector 63 is provided with an annular dovetail groove 64 surrounding its circumference. The sealing ring 7 is arranged partly in the annular dovetail groove 64. The sealing ring 7 extends partly out of the annular dovetail groove 64 and pushes against the inner wall of the air passage port 8A. In this way, the sealing ring 7 can be fixedly attached to the plug-in connector 63, and can combine with the plug-in connector 63 to become one piece to be plugged into the hot air hood 8, making it easy to assemble. At the same time, when performing a sealing function, the sealing ring 7 will be compressed and deformed by the compression force from both the plug-in connector 63 and the air passage port 8A. The annular dovetail groove 64 can be designed to fully accommodate the compressed portion of the sealing ring 7, and prevent the sealing ring 7 from being damaged and degrading the sealing function. At the same time, to further strengthen the sealing function, the sealing ring 7 may be an O-shaped sealing ring to couple with the annular dovetail groove 64.

In some embodiments, as shown in FIG. 5 and FIG. 6, a boss may be configured at a top surface of the hot air hood 8. The air passage port 8A is connected to the heating compartment 8C through the top surface of the boss. The clearance gap O is provided between the top surface of the boss and the inner top wall (i.e., the bottom surface of the coil bracket plate 1B) of the housing 1. The provision of the boss may increase an overall height of the air passage port 8A, and may increase a coupling length between the air passage port 8A and the plug-in connector 63, such that both can fully contact without separation when a relative movement occurs, and can further avoid failure of the sealing function. For example, a size of the clearance gap O is not less than 0.5 mm to avoid the compression force on the housing 1.

In some embodiments, as shown in FIG. 5 and FIG. 10, the hot air hood 8 and the dielectric window 9 are connected. The hot air hood 8 includes a hood body and a connecting member 8B disposed at an outer wall of the hood body. The hood body is fixedly attached to the dielectric window 9 through the connecting member 8B. Here, the connecting member 8B and the dielectric window 9 may be connected in a snap-on manner. For example, the connecting member 8B may be a snap-on structure such as a hook or a claw. Alternatively, the connecting member 8B may also be a slot. The dielectric window 9 is configured with an adapting hook on the top. The hood body is connected to the dielectric window 9 through snapping the adapting hook onto the slot. In another example, the connecting member 8B may also be exterior threads arranged on an outer wall of the hood body. The dielectric window 9 is configured with a threaded hole. Interior threads of the threaded hole match the exterior threads, and the connecting portion 8B is fixedly attached to the dielectric window 9 through threaded connection.

In some embodiments, the semiconductor processing chamber includes the following configuration. A hood opening is configured at the bottom of the hood body. An inner wall of the hood body and the top surface of the dielectric window 9 are enclosed to form the heating compartment 8C. A flanging is configured at a surrounding edge of the cover body located at the hood opening facing the outside of the heating compartment 8C. The flanging is the connecting member 8B. In some other embodiments, bolt through-holes are evenly distributed in a ring-shaped array on the flanging. The dielectric window 9 is configured with threaded holes corresponding to the bolt through-holes. External bolts pass through the bolt through-holes to connect to the threaded holes through threads to attach the hood body to the dielectric window 9.

In some embodiments, as shown in FIG. 5 and FIG. 10, the heating compartment 8C may include a plurality of heating sub-compartment 8C1 separated from each other. Each heating sub-compartment 8C1 is connected to two air passage ports 8A, that is, two air passage ports 8A form a group. The two air passage ports 8A in each group are connected to a same heating sub-compartment 8C1. The air passage ports 8A connected to different heating sub-compartments 8C1 are different. One of the two air passage ports 8A connected to the same heating sub-chamber is an air inlet for air intake, and the other of the two air passage ports 8A connected to the same heating sub-compartment 8C1 is an air outlet for air discharge. For example, multiple heating sub-compartments 8C1 may be arranged in the hot air hood 8 in a linear array or a circular array. Feeding hot air into multiple heating sub-compartments 8C1 at the same time makes the heating of the dielectric window 9 by the hot air hood 8 more rapid and more uniform, which is beneficial to the operation of the semiconductor processing chamber.

In some embodiments, the layout of multiple heating sub-compartments 8C1 may be as follows. As shown in FIG. 10, the heating compartment 8C includes a plurality of concentric ring-shaped compartments and a partition plate 8E extending in a radial direction of the plurality of concentric ring-shaped compartments. The partition plate 8E symmetrically divides each ring-shaped compartment into two half ring-shaped compartments. The half ring-shaped compartments are the heating sub-compartments 8C1. The air inlet and the air outlet connected to the same heating sub-compartment 8C1 are located at both ends of the same heating sub-compartment 8C1, such that the hot air entering the heating sub-compartment 8C1 can flow from one end of the heating sub-compartment 8C1 to the other end of the heating sub-compartment 8C1. The hot air passing into the heating sub-compartment 8C1 can fully exchange heat with the dielectric window 9 before being discharged. At the same time, interference due to close proximity between the air inlet and the air outlet may also be avoided. At the same time, the partition plate 8E not only separates the ring-shaped compartments, but also serves as a reinforcing rib to reinforce the hot air hood 8.

Further, as shown in FIG. 10, a first pressure release hole 8D1 is configured between two adjacent heating sub-compartments 8C1 with different diameters to facilitate connection between two adjacent heating sub-compartments 8C1 with different diameters, and to ensure consistency of air pressures between each other. At the same time, the heating sub-compartment 8C1 with the smallest diameter is configured with a second pressure release hole 8D2 connected to the outside of the heating compartment 8C, such that the second pressure release hole 8D2 and the first pressure release hole 8D1 are coordinated to connect between the inside and the outside of the hot air hood 8, such that the air pressures inside and outside the heating sub-compartments 8C1 are kept balanced.

In some embodiments, as shown in FIG. 5, the hot air hood 8 is configured with a through-hole, and an axis of the through-hole is coaxial with a central axis of the hot air hood 8. In some other embodiments, the hood body of the hot air hood 8 is annular-shaped. The through-hole is a ring hole of the annular hood body. One end of a nozzle 10 sequentially passes through the through-hole and the dielectric window 9 into the chamber 2. The other end of the nozzle 10 extends through the coil bracket plate 1B to the outside of the semiconductor processing chamber. The second pressure release hole 8D2 is connected to the through-hole to facilitate more effective pressure release and to more effectively ensure an air pressure balance inside and outside each heating sub-compartment 8C1.

Figure 11:
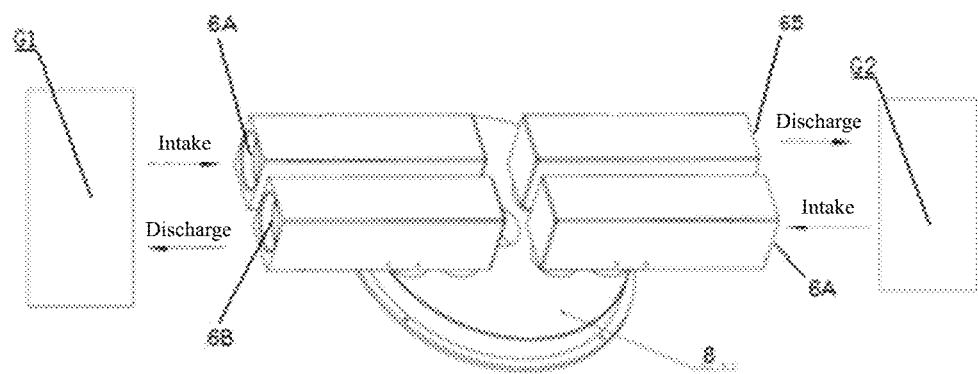
FIG. 11 is a schematic diagram showing coupling of a hot air hood and an air passage according to some embodiments of the present disclosure.

In some embodiments, as shown in FIG. 11, the number of air passages 6 is four. Two air passages are air intake passages 6A. The other two air passages are air discharge passages 6B. The two air intake passages 6A are respectively arranged on both sides of the partition plate 8E. The two air discharge passages 6B are also respectively arranged on both sides of the partition plate 8E. Each air intake passage 6A and each air discharge passage 6B both have two transfer ports 62. Each air intake passage 6A and each air discharge passage 6B both have the air exchange port 61.

The two transfer ports 62 of each air intake passage 6A are respectively connected to inlets of two adjacent heating sub-compartments 8C1 located on the same side of the partition plate 8E. The two transfer ports 62 of each air discharge passage 6B are respectively connected to outlets of two adjacent heating sub-compartments 8C1 located on the same side of the partition plate 8E. For example, as shown in FIG. 10, the heating compartment 8C includes two annular compartments, and is divided into four heating sub-compartments 8C1 by the partition plate 8E. Both ends of each heating sub-compartment 8C1 are respectively configured with one air passage port 8A, which serves as the air inlet and the air outlet. A total of 8 air passage ports 8A are arranged in two rows and symmetrically arranged on both sides of the partition plate 8E. For the two adjacent heating sub-compartments 8C1 with different diameters located on the same side of the partition plate 8E, the air inlets of the two are connected to the two transfer ports 62 of the air intake passage 6A located on the same side of the partition plate 8E. The air outlets of the two are connected to the two transfer ports 62 of the air discharge passage 6B located on the same side of the partition plate 8E. In this way, the two air passages 6 located on the same side of the partition plate 8E are arranged in pairs, such that the air intake and the air discharge of the two heating sub-compartments 8C1 on the same side of the partition plate 8E can be facilitated simultaneously. That is, the air intake passage 6A, the air discharge passage 6B, and the two heating sub-compartments 8C1 located on the same side of the partition plate 8E form a first air passage. The air intake passage 6A, the air discharge passage 6B, and the two heating sub-compartments 8C1 located on the other side of the partition plate 8E form a second air passage. Both the first air passage and the second air passage are arranged along an extending direction of the partition plate 8E. Thus, the structure of the air passages can be simplified, and the manufacturing cost can be better controlled.

In some embodiments, as shown in FIG. 7, the air passage structure is a split structure including four "F"-shaped passage structures. Each "F"-shaped passage structure is configured with one air passage 6. The air passage 6 includes two transfer ports 62 and one air exchange port 61. The air passage structure may also be an integral structure, which is not particularly limited in the embodiments of the present disclosure.

Further, as shown in FIG. 11, the air exchange ports 61 of the two air intake passages 6A are used to connect to the air outlet of a first heater G1 and the air outlet of a second heater G2 respectively. The air exchange ports 61 of the two air discharge passages 6B are used to connect to the air inlet of the first heater G1 and the air inlet of the second heater G2 respectively. When in operation, the first heater G1 passes the hot air into the two heating sub-chambers 8C1 connected to the first air passage through the air intake passages 6A of the first air passage. After the hot air fully exchanges heat with the dielectric window 9 in the heating sub-chamber 8C1, the hot air drops to a normal temperature, discharges from the air discharge passage 6B of the first air passage, and enters the second heater G2. The air at the normal temperature is heated again in the second heater G2 to become the hot air. The hot air passes into the two heating sub-chambers 8C1 connected to the second air passage through the air intake passages 6A of the second air passage. After the hot air fully exchange heat with the dielectric window 9 in the heating sub-chamber 8C1, the hot air drops to the normal temperature again, discharges from the air discharge passage 6B of the second air passage, and enters the first heater G1. As such, the first heater G1, the first air passage, the second heater G2, and the second air passage are connected end to end to form a circular heating loop, such that each heating sub-chamber 8C1 is continuously fed with the hot air to heat the dielectric window 9. Thus, the heating process is more reasonable and effective.

In some embodiments, both the first heater G1 and the second heater G2 include high-temperature electrodes, that is, generate the hot air through electric heating.

In the embodiments of the present disclosure, through directly fixing the hot air hood on the dielectric window, and configuring the clearance gap between the hot air hood and the inner top wall of the housing, the compression between the hot air hood and the housing can be avoided. The deformation of the inner top wall of housing caused by the compression between the hot air hood and the housing and the subsequent change of the coil distribution structure can be avoided. Thus, the uniform distribution of the ions and free radicals in the plasma is ensured.

The embodiments of the present disclosure are described by focusing on the differences between the various embodiments. As long as different optimization features of various embodiments do not contradict each other, they can be combined to form more desired embodiments. For brevity of the specification, further description is omitted herein.

The above descriptions are only examples of the present disclosure, and are not intended to limit the present disclosure. Various modifications and changes of the present disclosure will occur to those skilled in the art. Any modification, equivalent replacement, improvement, etc. made within the spirit and principle of the present disclosure shall be included within the scope of the claims of the present disclosure.

What is claimed is:

1. A semiconductor processing chamber, comprising:
a chamber having an opening at a top of the chamber;
a housing disposed above the opening;
a dielectric window disposed inside the housing and above the opening;
a coil arranged circumferentially at an inner top wall of the housing;
a hot air hood disposed inside the housing and fixedly attached to the dielectric window, wherein the hot air hood and the inner top wall of the housing are separated by a clearance gap, and the hot air hood includes a heating compartment for heating the dielectric window and at least two air passage ports connected to the heating compartment; and
an air distribution structure being fixedly attached to the housing and including a plurality of air passages, at least two air exchange ports located outside the housing for air intake and air discharge, and at least two transfer ports located inside the housing and respectively connected to the at least two air exchange ports, wherein equal numbers of exchange ports and transfer ports are connected to each other in a one-to-one correspondence.

2. The semiconductor processing chamber according to claim 1, wherein:
the hot air hood includes a hood body and a connecting member disposed at an outer wall of the hood body, and the hood body is fixedly attached to the dielectric window through the connecting member.

3. The semiconductor processing chamber according to claim 2, wherein:
a hood opening is configured at a bottom of the hood body, an inner wall of the hood body and a top surface of the dielectric window are enclosed to form the heating compartment, and a flanging is configured at a surrounding edge of the hood body located at the hood opening facing the outside of the heating compartment, and the flanging is the connecting member.

4. The semiconductor processing chamber according to claim 1, wherein:
the air distribution structure includes at least two plug-in connectors, each plug-in connector includes a transfer port, the plug-in connector is inserted into an air passage port to connect between the transfer port and the air passage port, and a sealing ring is configured between an outer wall of the plug-in connector and an inner wall of the air passage port to seal the air passage port.

5. The semiconductor processing chamber according to claim 4, wherein:
the outer wall of the plug-in connector is configured with an annular dovetail groove surrounding its circumference, the sealing ring is arranged partly in the annular dovetail groove, the sealing ring extends partly out of the annular dovetail groove and pushes against the inner wall of the air passage port.

6. The semiconductor processing chamber according to claim 1, wherein:
the heating compartment includes a plurality of heating sub-compartment separated from each other, each heating sub-compartment is connected to two air passage ports, the air passage ports connected to different heating sub-compartments are different, one of the two air passage ports connected to the same heating sub-compartment is an air inlet for air intake, and the other of the two air passage ports connected to the same heating sub-compartment is an air outlet for air discharge.

7. The semiconductor processing chamber according to claim 6, wherein:
the heating compartment includes a plurality of concentric ring-shaped compartments and a partition plate extending in a radial direction of the plurality of concentric ring-shaped compartments, the partition plate symmetrically divides each ring-shaped compartment into two half ring-shaped compartments, the half ring-shaped compartments are the heating sub-compartments, and the air inlet and the air outlet connected to the same heating sub-compartment are located at both ends of the same heating sub-compartment.

8. The semiconductor processing chamber according to claim 6, wherein:
a first pressure release hole is configured between two adjacent heating sub-compartments with different diameters to facilitate connection between two adjacent heating sub-compartments with different diameters, and the heating sub-compartment with the smallest diameter is configured with a second pressure release hole connected to the outside of the heating compartment.

9. The semiconductor processing chamber according to claim 6, wherein:

the number of air passages is four, two air passages are air intake passages, the other two air passages are air discharge passages, the two air intake passages are respectively arranged on both sides of the partition plate, the two air discharge passages are also respectively arranged on both sides of the partition plate, each air intake passage and each air discharge passage both have two transfer ports, and each air intake passage and each air discharge passage both have the air exchange port;

the two transfer ports of each air intake passage are respectively connected to inlets of two adjacent heating sub-compartments located on the same side of the partition plate; and the two transfer ports of each air discharge passage are respectively connected to outlets of two adjacent heating sub-compartments located on the same side of the partition plate.

10. The semiconductor processing chamber according to claim 9, wherein:

the air exchange ports of the two air intake pipes are used to connect to the air outlet of a first heater and the air outlet of a second heater, respectively; and the air exchange ports of the two air discharge passages are used to connect to the air inlet of the first heater and the air inlet of the second heater, respectively.

11. The semiconductor processing chamber according to claim 1, wherein:

a boss is configured at a top surface of the hot air hood, the air passage port is connected to the heating compartment through a top surface of the boss, and the clearance gap is configured between the top surface of the boss and the inner top wall of the housing.

* * * * *